(12) United States Patent
Okuda et al.

(10) Patent No.: US 6,538,589 B2
(45) Date of Patent: Mar. 25, 2003

(54) DIGITAL ΔΣ MODULATOR AND D/A CONVERTER USING THE MODULATOR

(75) Inventors: Takashi Okuda, Tokyo (JP); Toshio Kumamoto, Tokyo (JP); Yasuo Morimoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/136,416

(22) Filed: May 2, 2002

(65) Prior Publication Data

US 2002/0196169 A1 Dec. 26, 2002

(30) Foreign Application Priority Data

Jun. 8, 2001 (JP) ........................................ 2001-174597

(51) Int. Cl.[7] ................................................ H03M 3/00
(52) U.S. Cl. ........................................ 341/143; 341/144
(58) Field of Search .............................. 341/143, 144, 341/155

(56) References Cited

U.S. PATENT DOCUMENTS

| | | | | |
|---|---|---|---|---|
| 5,068,661 A | * | 11/1991 | Kaneaki et al. | 341/143 |
| 5,274,375 A | * | 12/1993 | Thompson | 341/143 |
| 5,446,460 A | * | 8/1995 | Cabler | 341/143 |
| 5,500,645 A | * | 3/1996 | Ribner et al. | 341/143 |
| 5,870,048 A | * | 2/1999 | Kuo et al. | 341/143 |
| 6,323,794 B1 | * | 11/2001 | Okuda et al. | 341/143 |

OTHER PUBLICATIONS

Yasuyuki Matsuya et al., "A 17–bit Oversampling D–to–A Conversion Technology Using Multistage Noise Shaping", IEEE Journal of Solid–State Circuits, vol. 24, No. 4, Aug. 1989, pp. 969–975, Institute and Electronics Engineers (IEEE), New York, NY.

* cited by examiner

Primary Examiner—Peguy Jeanpierre
(74) Attorney, Agent, or Firm—Burns, Doane, Swecker & Mathis, LLP (57) ABSTRACT

A digital ΔΣ modulator comprises a first-stage 1-bit ΔΣ modulator provided with an 1-bit (1 is an arbitrary natural number) quantizer, for modulating digital data, a correction logic for multiplying a quantization error caused in the 1-bit quantizer by a correction so that the quantization error caused in the 1-bit quantizer is eliminated at an output of the first-stage 1-bit ΔΣ modulator, and a next-stage m-bit ΔΣ modulator provided with an m-bit (m is an arbitrary natural number larger than 1) quantizer, for modulating and feeding the quantization error which is multiplied by the correction by the correction logic back to the first-stage 1-bit ΔΣ modulator.

18 Claims, 13 Drawing Sheets

DIGITAL ΔΣ MODULATOR AND D/A CONVERTER USING THE MODULATOR

BACKGROUND OF THE INVENTION

1. Field of the Invention

The present invention relates to a digital ΔΣ modulator that permits the same accuracy as in the case of using a multibit quantizer and to a D/A converter using the digital ΔΣ modulator.

2. Description of the Prior Art

Figure 11:
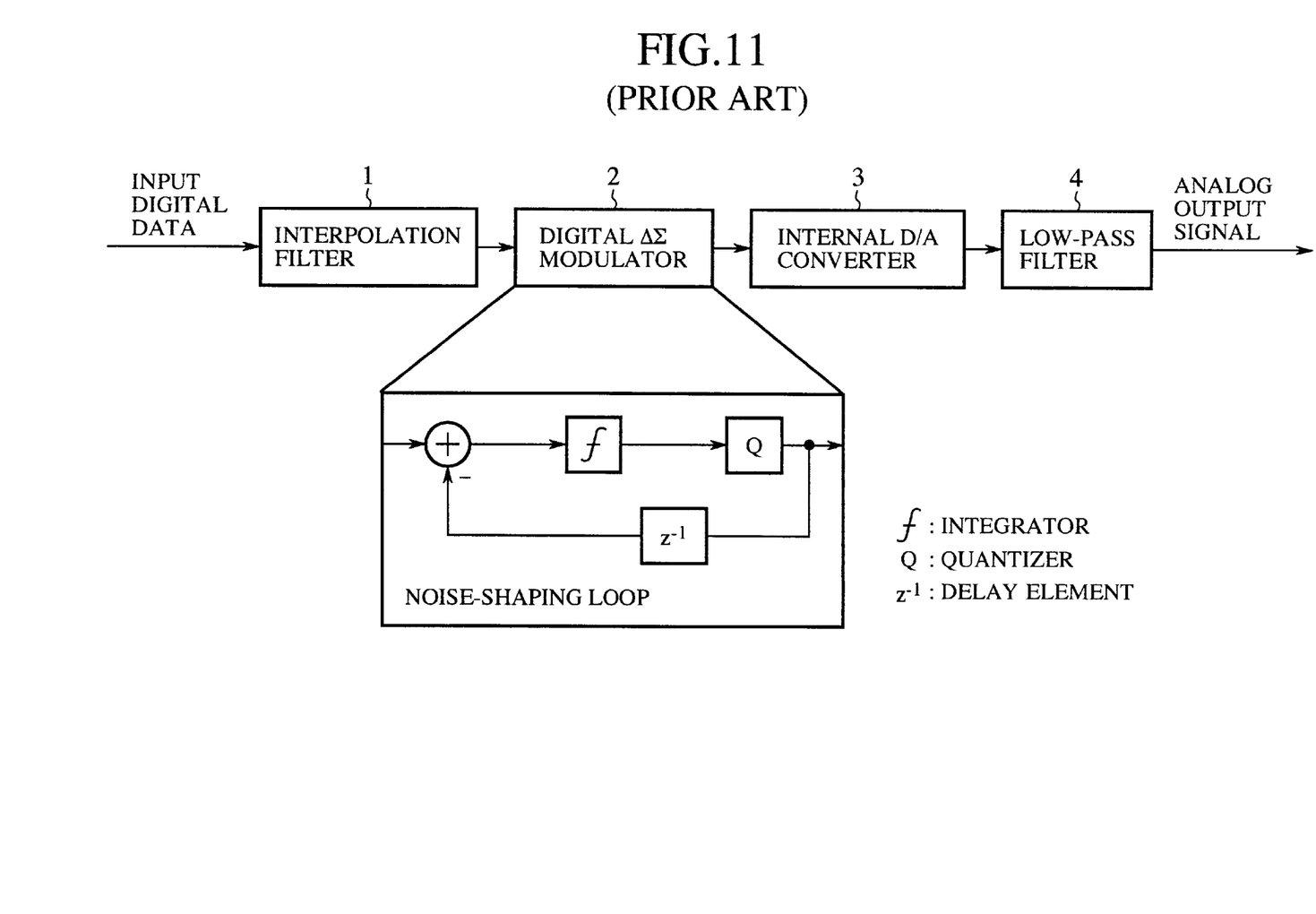
FIG. 11 is a block diagram showing the structure of a D/A converter which employs a prior art 1st-order digital ΔΣ modulator.

FIG. 11 is a block diagram showing the structure of a D/A converter which employs a prior art 1st-order digital ΔΣ modulator. In the figure, reference numeral 1 denotes an interpolation filter that increases the sampling rate of input digital data, and reference numeral 2 denotes a digital ΔΣ modulator for modulating and noise-shaping the input digital data with the increased sampling rate and for furnishing a 1-bit output. The digital ΔΣ modulator 2 consists of subtracters, integrators, a quantizer, and a delay element. Reference numeral 3 denotes an internal D/A converter for converting the noise-shaped digital data from the digital ΔΣ modulator 2 into analog data, and reference numeral 4 denotes a low-pass filter for eliminating out of band noise included in the analog data.

An over sampling ΔΣ conversion method is widely used as a conversion method for D/A converters which operate in a voice and audio band. FIG. 11 shows the basic structure of the D/A converter which employs the 1st-order digital ΔΣ modulator.

In operation, the interpolation filter 1 increases the sampling rate of input digital data. The digital ΔΣ modulator 2 modulates the input digital data with the increased sampling rate and then noise-shapes the modulated digital data. The internal D/A converter 3 converts the noise-shaped digital data into analog data. The low-pass filter 4 then eliminates out of band noise included in the analog data from the internal D/A converter 3 and outputs the filtered analog data.

As previously mentioned, the digital ΔΣ modulator 2 consists of subtracters, integrators, a quantizer, and a delay element. Factors that determine the accuracy of the modulator include the order of the modulator and the number of bits per sample which the quantizer provides. The order of the modulator is decided according to how many integrators are inserted in the signal path of the modulator. For example, when the modulator has two integrators, the modulator is a second-order one.

Figure 12A:
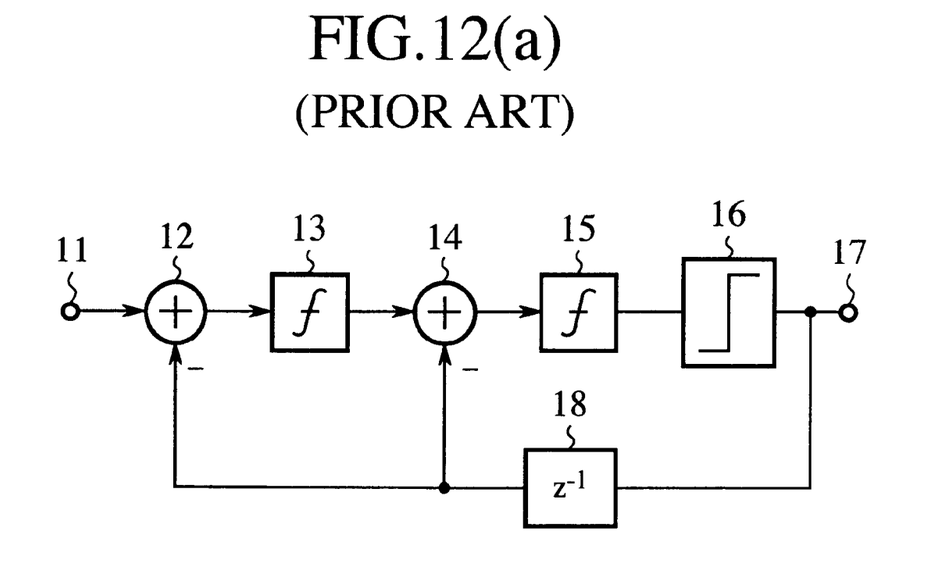
Figure 12B:
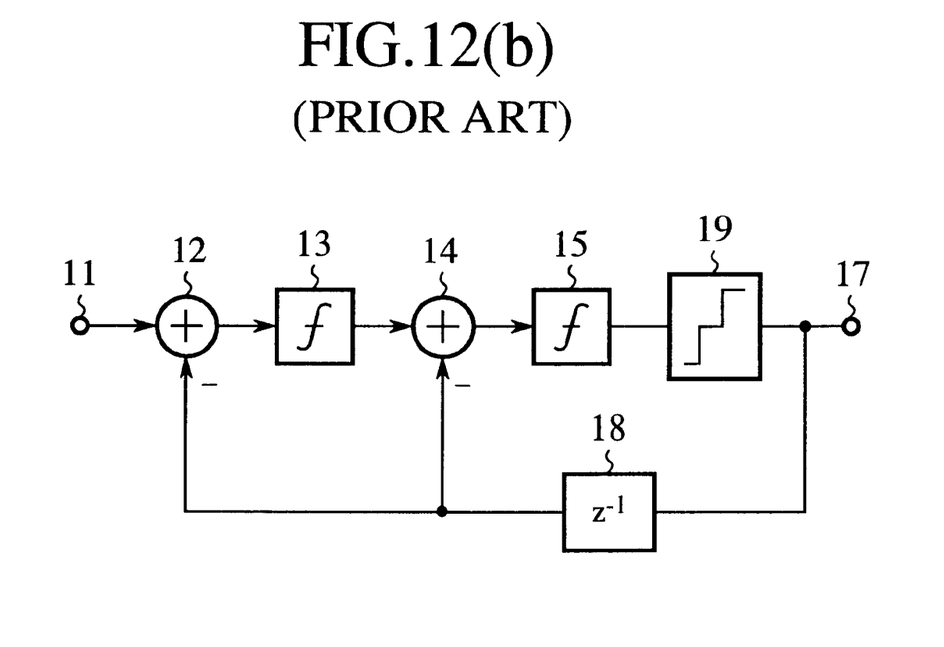

FIG. 12(a) is a block diagram showing the structure of a prior art 1-bit second-order digital ΔΣ modulator. In the figure, reference numeral 11 denotes a input unit, reference numeral 12 denotes a subtracter, reference numeral 13 denotes an integrator, reference numeral 14 denotes a subtracter, reference numeral 15 denotes an integrator, reference numeral 16 denotes a 1-bit quantizer, reference numeral 17 denotes an output unit, and reference numeral 18 denotes a delay element. FIG. 12(b) is a block diagram showing the structure of a prior art multibit second-order digital ΔΣ modulator. In the figure, reference numeral 19 denotes a multibit quantizer. The other structure of the multibit second-order digital ΔΣ modulator is the same as that of the 1-bit second-order digital ΔΣ modulator as shown in FIG. 12(a).

In general, the higher order the modulator has and the greater number of bits per sample the quantizer provides, the greater accuracy the digital ΔΣ modulator permits. A multibit digital ΔΣ modulator that employs a multibit quantizer permits greater accuracy if it has the same order as a 1-bit digital ΔΣ modulator. However, mismatch of unit element circuits included in the internal D/A converter 3 of FIG. 11 are not avoided, and it is known that the accuracy is deteriorated as compared with its theoretical value.

Figure 13:
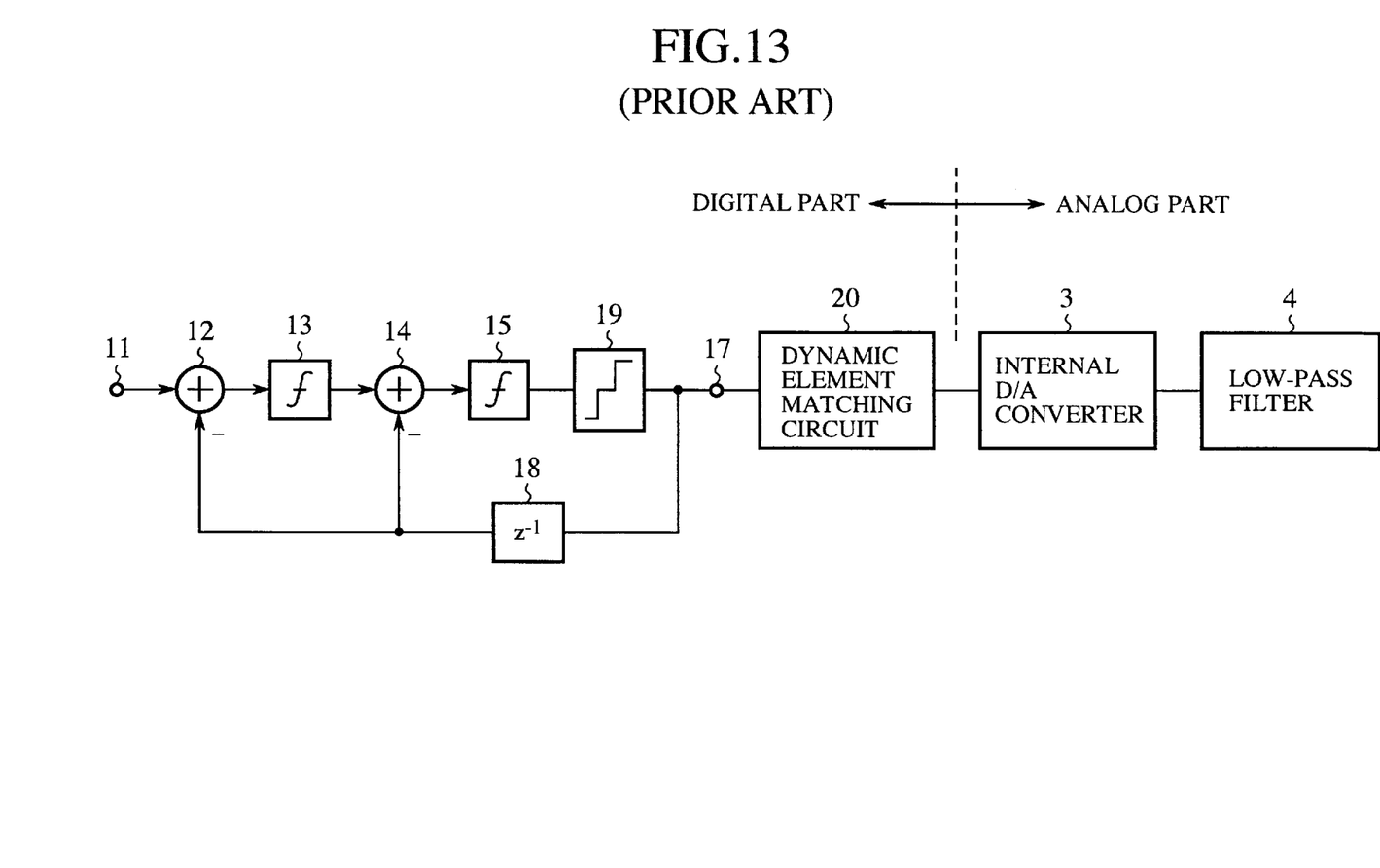
FIG. 13 is a block diagram showing the structure of a D/A converter which employs a prior art multibit digital ΔΣ modulator.

FIG. 13 is a block diagram showing the structure of a D/A converter which employs a prior art multibit digital ΔΣ modulator. In the figure, reference numeral 20 denotes a dynamic element matching circuit (referred to as DEM from here on) disposed between a multibit second-order digital ΔΣ modulator and an internal D/A converter 3.

In order to decrease the deterioration of the accuracy due to mismatch of unit element circuits included in the internal D/A converter 3, it is indispensable to dispose the DEM 20 as a former stage located immediately before the internal D/A converter 3. The greater number of bits the output of the multibit digital ΔΣ modulator has, the larger scale the DEM 20 has and therefore the structure of the DEM 20 becomes more complex. It is therefore desirable that the D/A converter includes a digital ΔΣ modulator that sends out a 1-bit digital output and that provides noise-shaping characteristics which are similar to those in the case of using a multibit quantizer.

A problem with a prior art digital ΔΣ modulator using a multibit quantizer that although it permits a high degree of accuracy, mismatch of unit element circuits included in an internal D/A converter 3 are not avoided and, when a DEM 20 is disposed as a former stage located immediately before the internal D/A converter 3 to decrease the accuracy deterioration due to the mismatch of unit element circuits included in the internal D/A converter 3, the circuit scale of the DEM 20 increases and therefore the structure of the DEM 20 becomes complex.

SUMMARY OF THE INVENTION

The present invention is proposed to solve the above-mentioned problem, and it is therefore an object of the present invention to provide a digital ΔΣ modulator that permits accuracy similar to that provided by a prior art digital ΔΣ modulator using a multibit quantizer and that reduces its circuit scale, and a D/A converter using the digital ΔΣ modulator.

In accordance with an aspect of the present invention, there is provided a digital ΔΣ modulator comprising: a first-stage 1-bit ΔΣ modulator provided with an 1-bit (1 is an arbitrary natural number) quantizer, for modulating digital data; a correction logic for multiplying a quantization error caused in the 1-bit quantizer by a correction so that the quantization error caused in the 1-bit quantizer is eliminated at an output of the first-stage 1-bit ΔΣ modulator; and a next-stage m-bit ΔΣ modulator provided with an m-bit (m is an arbitrary natural number larger than 1) quantizer, for modulating and feeding the quantization error which is multiplied by the correction by the correction logic back to the first-stage 1-bit ΔΣ modulator. In general, when a prior art m-bit digital ΔΣ modulator is applied to a D/A converter, the greater number of bits per sample an m-bit quantizer included in the digital ΔΣ modulator provides, the more a DEM to be located immediately behind the digital ΔΣ modulator is complicated and the larger scale the DEM has. However, by using a small-scale DEM as compared with a DEM needed by a prior art m-bit digital ΔΣ modulator using an m-bit quantizer, the digital ΔΣ modulator according to this aspect of the present invention can permit accuracy similar to that provided by the prior art m-bit digital ΔΣ modulator, thereby reducing the circuit scale.

In accordance with another aspect of the present invention, the first-stage 1-bit ΔΣ modulator is a 1-bit ΔΣ modulator having a 1-bit quantizer. Since an output is sent out of the first-stage 1-bit ΔΣ modulator, a final output of the digital ΔΣ modulator is a 1-bit data stream and therefore no DEM needs to be used. Accordingly, the digital ΔΣ modulator with a simple structure permits accuracy similar to that provided by a prior art m-bit digital ΔΣ modulator using an m-bit quantizer, thereby reducing the circuit scale.

In accordance with a further aspect of the present invention, the next-stage m-bit ΔΣ modulator feeds its modulated output back to an input of the first-stage 1-bit ΔΣ modulator. The digital ΔΣ modulator according to the aspect of the present invention can permit accuracy similar to that provided by a prior art m-bit digital ΔΣ modulator using an m-bit quantizer, by using a small-scale DEM, thereby reducing the circuit scale.

In accordance with another aspect of the present invention, the next-stage m-bit ΔΣ modulator feeds its modulated output back to a node between two or more integrators disposed in the first-stage 1-bit ΔΣ modulator. This results in an increase in the order of modulation which makes it possible to permit a higher degree of accuracy.

In accordance with a further aspect of the present invention, the next-stage m-bit ΔΣ modulator feeds its modulated output back to a node located immediately before the 1-bit quantizer of the first-stage 1-bit ΔΣ modulator. This results in a further increase in the order of the modulation which makes it possible to permit a higher degree of accuracy. In addition, the correction logic can be omitted.

In accordance with another aspect of the present invention, the first-stage 1-bit ΔΣ modulator has a same order as the next-stage m-bit ΔΣ modulator. Since the first-stage 1-bit ΔΣ modulator and the next-stage m-bit ΔΣ modulator have almost similar circuit blocks, the circuit structure can be simplified.

In accordance with a further aspect of the present invention, the next-stage m-bit ΔΣ modulator has a greater order than the first-stage 1-bit ΔΣ modulator. The degree of accuracy can be improved only by an increment in the order of the next-stage m-bit ΔΣ modulator.

In accordance with another aspect of the present invention, the quantization error caused in the 1-bit quantizer is acquired from a difference between an input and an output of the 1-bit quantizer. The correction logic can be constructed of a differentiator.

In accordance with a further aspect of the present invention, the quantization error caused in the 1-bit quantizer is acquired from a difference between an input and an output of the first-stage 1-bit ΔΣ modulator. The correction logic can be constructed of an integrator.

In accordance with another aspect of the present invention, there is provided a D/A converter comprising: an interpolation filter for increasing a sampling rate of digital data; a digital ΔΣ modulator for modulating and noise-shaping the digital data with the sampling rate increased by the interpolation filter, the digital ΔΣ modulator including a first-stage 1-bit ΔΣ modulator provided with an 1-bit (1 is an arbitrary natural number) quantizer, for modulating digital data, a correction logic for multiplying a quantization error caused in the 1-bit quantizer by a correction so that the quantization error caused in the 1-bit quantizer is eliminated at an output of the first-stage 1-bit ΔΣ modulator, and a next-stage m-bit ΔΣ modulator provided with an m-bit (m is an arbitrary natural number larger than 1) quantizer, for modulating and feeding the quantization error which is multiplied by the correction by the correction logic back to the first-stage 1-bit ΔΣ modulator; an internal D/A converter for converting the digital data noise-shaped by the digital ΔΣ modulator into analog data; and a low-pass filter for eliminating out of band noise included in the analog data obtained by the internal D/A converter. Accordingly, the D/A converter with a simple structure permits a high degree of accuracy.

Further objects and advantages of the present invention will be apparent from the following description of the preferred embodiments of the invention as illustrated in the accompanying drawings.

BRIEF DESCRIPTION OF THE DRAWINGS

FIG. 12($a$) is a block diagram showing the structure of a prior art 1-bit second-order digital ΔΣ modulator;

FIG. 12($b$) is a block diagram showing the structure of a prior art multibit second-order digital ΔΣ modulator.

DETAILED DESCRIPTION OF THE PREFERRED EMBODIMENTS

Embodiment 1

Figure 1:
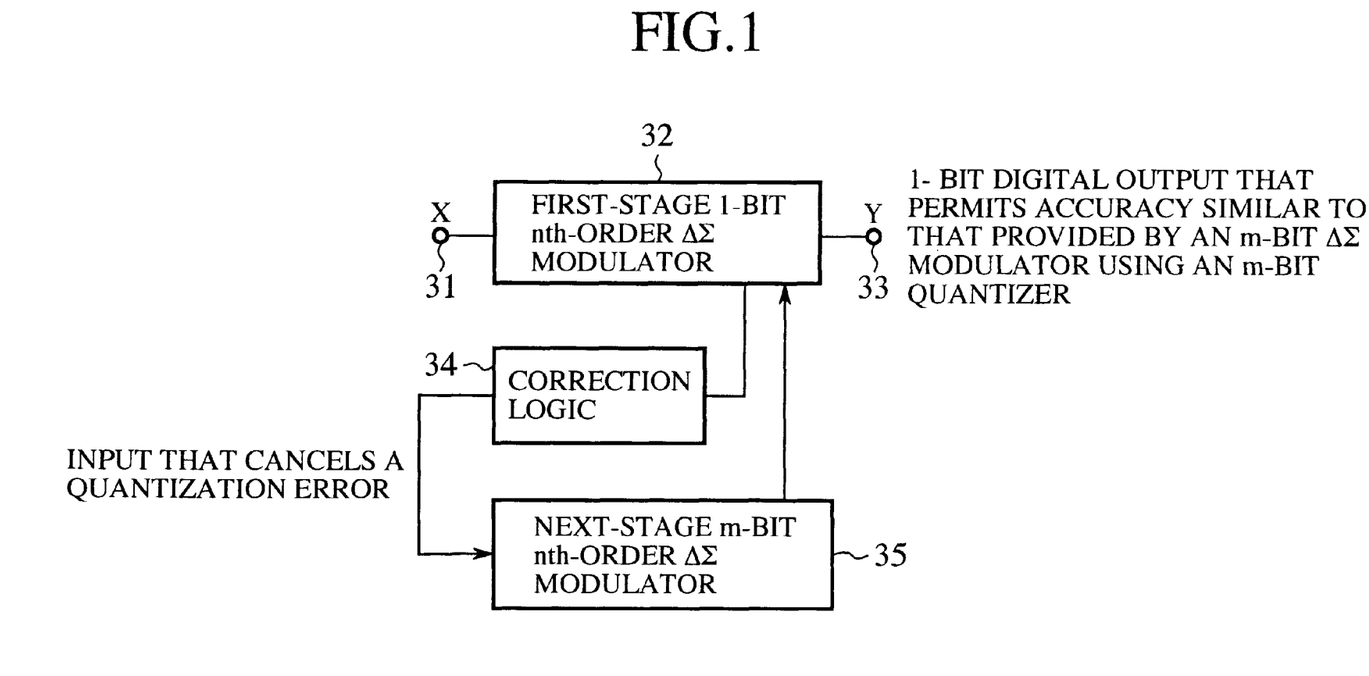
FIG. 1 is a block diagram showing the structure of a 1-bit nth-order digital ΔΣ modulator according to a first embodiment of the present invention.

FIG. 1 is a block diagram schematically showing the structure of a 1-bit nth-order ($n \geq 1$) ΔΣ modulator according to a first embodiment of the present invention. In the figure, reference numeral 31 denotes an input unit for receiving digital data, reference numeral 32 denotes a first-stage 1-bit nth-order ΔΣ modulator provided with a 1-bit quantizer, for modulating and noise-shaping the digital data from the input unit 31, reference numeral 33 denotes an output unit for outputting the modulated and noise-shaped digital data, reference numeral 34 denotes a correction logic by multiplying a quantization error caused by the 1-bit quantizer of the first-stage 1-bit nth-order ΔΣ modulator 32 by a correction, and reference numeral 35 denotes a next-stage m-bit (m≧1) nth-order ΔΣ modulator provided with an m-bit quantizer, for modulating and feeding the quantization error which is multiplied by the correction by the correction logic 34 back to the first-stage 1-bit nth-order ΔΣ modulator 32.

In operation, the first-stage 1-bit nth-order ΔΣ modulator 32 modulates input digital data from the input unit 31, and acquires a quantization error caused in the 1-bit quantizer thereof and outputs the quantization error to the correction logic 34. The correction logic 34 multiplies the quantization error by a correction so that the quantization error is eliminated at the output unit 33 of the first-stage 1-bit nth-order ΔΣ modulator 32, and then outputs the corrected quantization error to the next-stage m-bit nth-order ΔΣ modulator 35. The next-stage m-bit nth-order ΔΣ modulator 35 modulates the quantization error which is multiplied by the correction by the correction logic 34 and feeds the modulated, corrected quantization error back to the first-stage 1-bit nth-order ΔΣ modulator 32.

As a result, since an output is sent out of the first-stage 1-bit nth-order ΔΣ modulator 32, a final output of the 1-bit nth-order digital ΔΣ modulator of the first embodiment of the present invention is a 1-bit data stream. Therefore, when the 1-bit nth-order digital ΔΣ modulator of the first embodiment is applied to a D/A converter, no DEM needs to be used. In addition, the 1-bit nth-order digital ΔΣ modulator with a simpler structure compared with a prior art m-bit digital ΔΣ modulator using an m-bit quantizer as shown in FIG. 12(b) permits accuracy similar to that provided by the prior art m-bit digital ΔΣ modulator.

Embodiment 2

Figure 2:
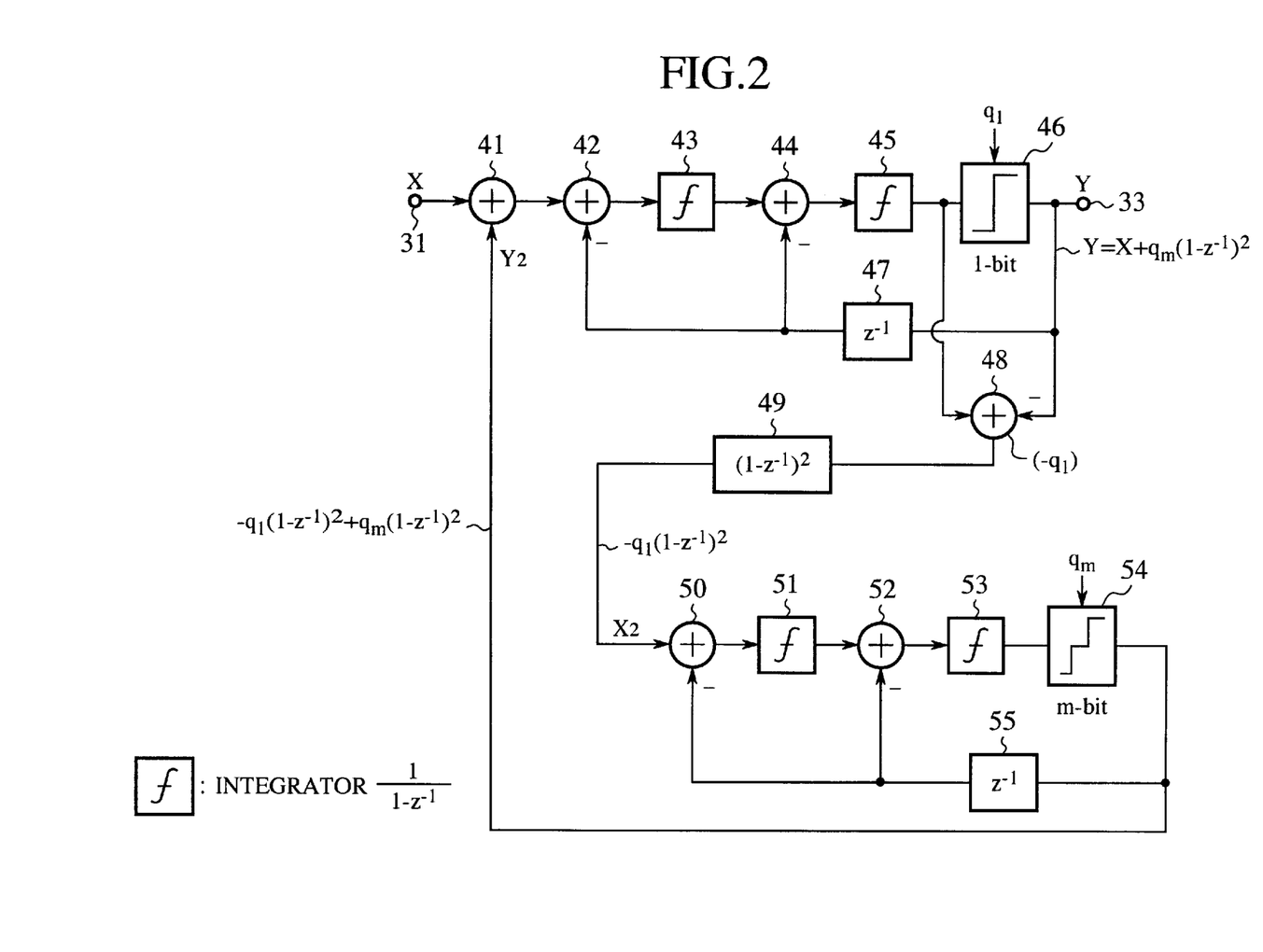
FIG. 2 is a block diagram showing the structure of a 1-bit nth-order digital ΔΣ modulator according to a second embodiment of the present invention.

FIG. 2 is a block diagram showing the structure of a 1-bit nth-order digital ΔΣ modulator according to a second embodiment of the present invention. In the figure, reference numeral 41 denotes an adder, reference numerals 42, 44, 48, 50, and 52 denote subtracters, reference numerals 43, 45, 51, and 53 denote integrators, reference numeral 46 denotes a 1-bit quantizer, reference numerals 47 and 55 denote delay elements, reference numeral 49 denotes a correction logic that consists of a differentiator, and reference numeral 54 denotes an m-bit quantizer. A first-stage 1-bit nth-order ΔΣ modulator is a stage located before the correction logic 49, and a next-stage m-bit nth-order ΔΣ modulator is a stage located behind the correction logic 49.

In operation, the first-stage 1-bit nth-order ΔΣ modulator calculates a difference (i.e., quantization error: $-q_1$) between input data and output data of the 1-bit quantizer 46 by means of the subtracter 48, and then outputs a signal ($X_2$) to the next-stage m-bit nth-order ΔΣ modulator. At that time, the correction logic 49 multiplies the difference from the subtracter 48 by a correction so that a quantization error ($q_1(1-z^{-1})^n$) caused in the output unit 33 of the first-stage 1-bit nth-order ΔΣ modulator is eliminated. This correction can be implemented only via a differentiator ($(1-z^{-1})^n$).

The next-stage m-bit nth-order ΔΣ modulator modulates the output of the correction logic 49, i.e., $X_2$, and feeds an output ($Y_2$) back to the adder 41 disposed at an input side of the first-stage integrator 43. As a result, the 1-bit nth-order digital ΔΣ modulator according to the second embodiment of the present invention can permit accuracy similar to that provided by a prior art m-bit digital ΔΣ modulator, as shown in FIG. 12(b), even though the 1-bit nth-order digital ΔΣ modulator furnishes a 1-bit output, and therefore a D/A converter including the 1-bit nth-order digital ΔΣ modulator according to the second embodiment needs no DEM. Furthermore, since both the first-stage modulator and the next-stage modulator are the same nth-order modulators having almost the same circuit block, the structure of the 1-bit nth-order digital ΔΣ modulator can be simplified. The transfer functions of nodes are given by:

$$X_2 = -q_1(1-z^{-1})^n$$

$$Y_2 = -q_1(1-z^{-1})^n + q_m(1-z^{-1})^n$$

$$Y = X + q_m(1-z^{-1})^n$$

In the case where the 1-bit nth-order digital ΔΣ modulator is a second-order modulator as shown in FIG. 2, the transfer functions are given by:

$$X_2 = -q_1(1-z^{-1})^2$$

$$Y_2 = -q_1(1-z^{-1})^2 + q_m(1-z^{-1})^2$$

$$Y = X + q_m(1-z^{-1})^2$$

Embodiment 3

Figure 3:
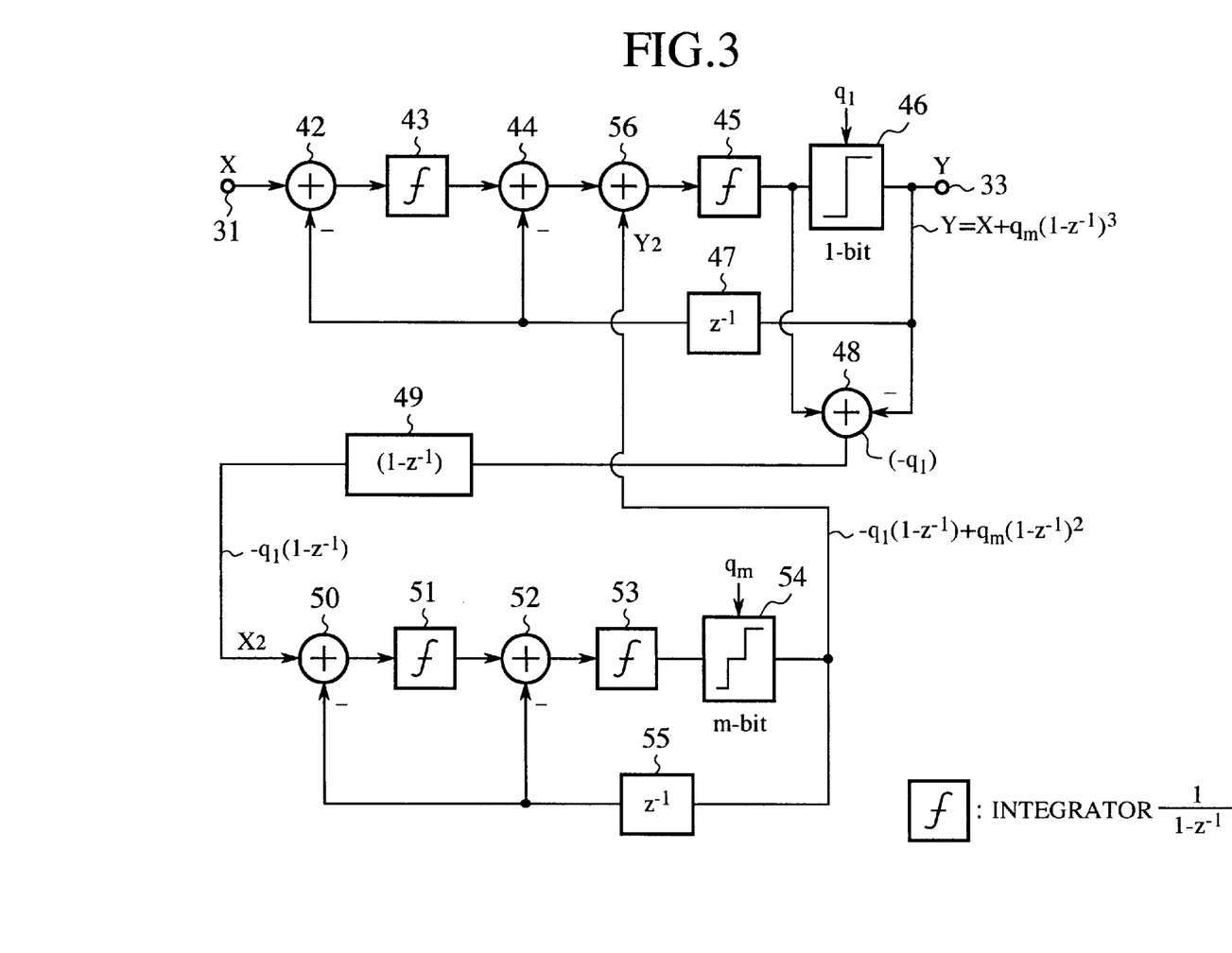
FIG. 3 is a block diagram showing the structure of a 1-bit nth-order digital ΔΣ modulator according to a third embodiment of the present invention.

FIG. 3 is a block diagram showing the structure of a 1-bit nth-order digital ΔΣ modulator according to a third embodiment of the present invention. In the figure, reference numeral 56 denotes an adder disposed between a first-stage integrator 43 and a next-stage integrator 45, instead of the adder 41 as shown in FIG. 2. The output of a next-stage m-bit nth-order ΔΣ modulator is fed back to the adder 56. The other structure of the 1-bit nth-order digital ΔΣ modulator according to the third embodiment of the present-invention is the same as that of the 1-bit nth-order digital ΔΣ modulator according to the second embodiment as shown in FIG. 2.

In operation, in accordance with the third embodiment, the output of the next-stage m-bit nth-order ΔΣ modulator is fed back to the adder 56 located between the two integrators 43 and 45 disposed in the first-stage 1-bit nth-order ΔΣ modulator.

For example, when the output of the next-stage m-bit nth-order ΔΣ modulator is fed back to an output side of a kth integrator disposed in the first-stage 1-bit nth-order ΔΣ modulator, the first-stage 1-bit nth-order ΔΣ modulator performs a kth-order modulation on the output of the next-stage m-bit nth-order ΔΣ modulator. Therefore, the correction logic 49 becomes $((1-z^{-1})^{n-k})$. The next-stage m-bit nth-order ΔΣ modulator performs an nth-order modulation on the quantization error ($q_m$) of the next-stage m-bit nth-order ΔΣ modulator, and the first-stage 1-bit nth-order ΔΣ modulator further performs a kth-order modulation on the quantization error ($q_m$). As a result, an (n+k)th-order modulation is performed on the quantization error. In this case, since the order of the modulation goes up from nth-order to (n+k)th-order, as mentioned above, the third embodiment offers an advantage of being able to permit a higher degree of accuracy in addition to the advantage provided by the second embodiment of the present invention. In accordance with the third embodiment, the transfer functions of nodes are given by:

$$X_2 = -q_1(1-z^{-1})^{n-k}$$

$$Y_2 = -q_1(1-z^{-1})^{n-k} + q_m(1-z^{-1})^n$$

$$Y=X+\{-q_1(1-z^{-1})^{n-k}+q_m\binom{n}{}\cdot(1-z^{-1})^k+q_1(1-z^{-1})^n$$

$$=X+q_m(1-z^{-1})^{n+k}$$

In the case where the 1-bit nth-order digital $\Delta\Sigma$ modulator is a second-order modulator as shown in FIG. 3, the transfer functions are given by:

$$X_2=-q_1(1-z^{-1})$$

$$Y_2=-q_1(1-z^{-1})+q_m(1-z^{-1})^2$$

$$Y=X+\{-q_1(1-z^{-1})+q_m(1-z^{-1})^2\}\cdot(1-z^{-1})+q_1(1-z-1)^2$$

$$=X+q_m(1-z^{-1})^3$$

Figure 4:
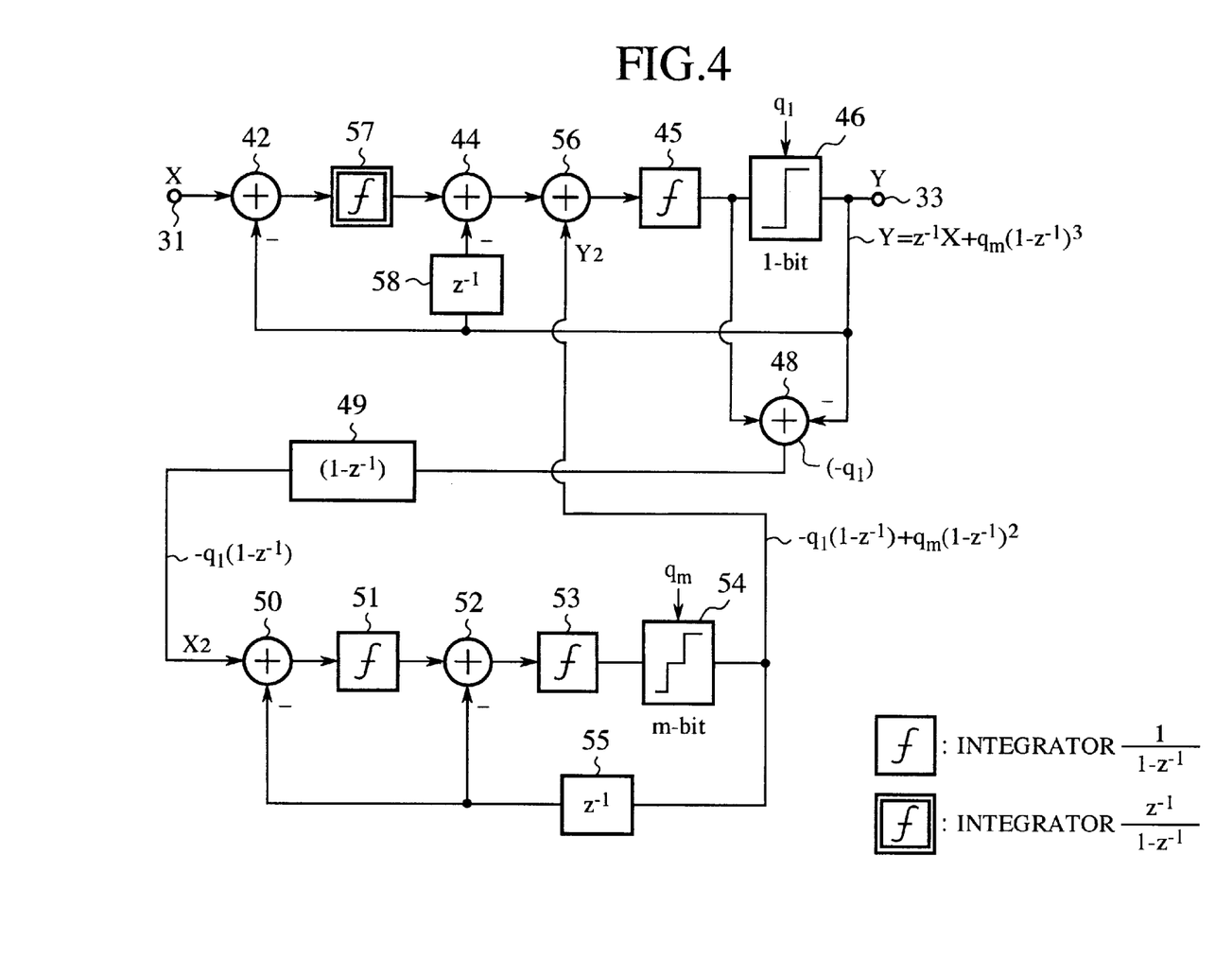
FIG. 4 is a block diagram showing the structure of a 1-bit nth-order digital ΔΣ modulator according to a variant of the third embodiment of the present invention.

FIG. 4 is a block diagram showing the structure of a 1-bit nth-order digital $\Delta\Sigma$ modulator according to a variant of the third embodiment of the present invention. In the figure, reference numeral 57 denotes an integrator disposed instead of the integrator 43 of FIG. 3, and reference numeral 58 denotes a delay element disposed instead of the delay element 47 of FIG. 3. The variant including such the integrator 57 and the delay element 58 provides the same advantage.

Embodiment 4

Figure 5:
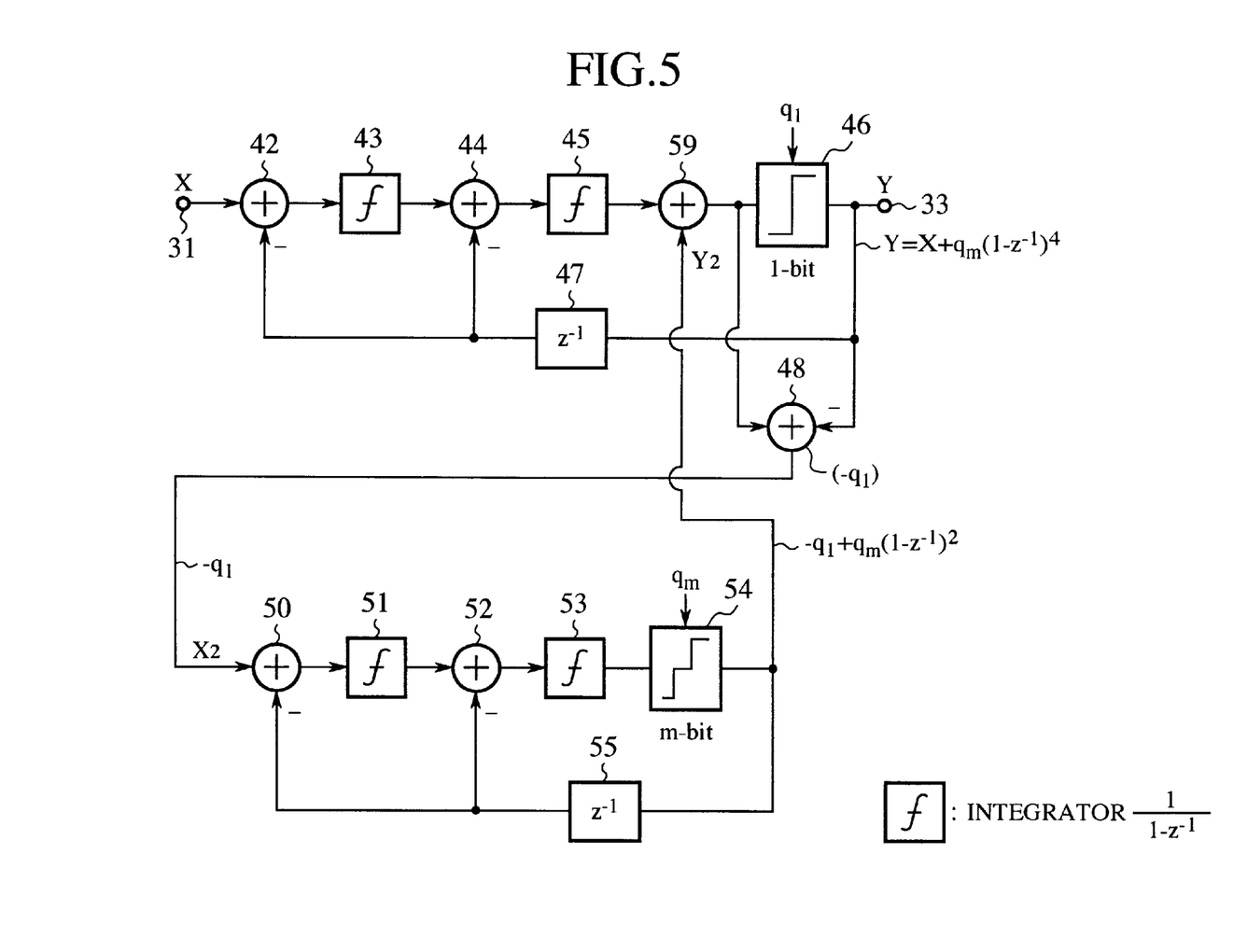
FIG. 5 is a block diagram showing the structure of a 1-bit nth-order digital ΔΣ modulator according to a fourth embodiment of the present invention.

FIG. 5 is a block diagram showing the structure of a 1-bit nth-order digital $\Delta\Sigma$ modulator according to a fourth embodiment of the present invention. In the figure, reference numeral 59 denotes an adder located immediately before a 1-bit quantizer 46, instead of either the adder 41 of FIG. 2 or the adder 56 of FIG. 3. The output of a next-stage m-bit nth-order $\Delta\Sigma$ modulator is fed back to the adder 59. The other structure of the 1-bit nth-order digital $\Delta\Sigma$ modulator according to the fourth embodiment of the present invention is the same as that of the 1-bit nth-order digital $\Delta\Sigma$ modulator according to the second or third embodiment as shown in FIG. 2 or 3.

In operation, in accordance with the fourth embodiment, the output of the next-stage m-bit nth-order $\Delta\Sigma$ modulator is fed back to the adder 59 located immediately before the 1-bit quantizer of the first-stage 1-bit nth-order $\Delta\Sigma$ modulator.

The first-stage 1-bit nth-order $\Delta\Sigma$ modulator performs an nth-order modulation on the data fed back to a node located immediately before the 1-bit quantizer 46. Therefore, since data to be furnished to the next-stage m-bit nth-order $\Delta\Sigma$ modulator only has to have a value of quantization error $(-q_1)$ caused by the 1-bit quantizer 46, the correction logic 49 can be omitted. In addition, the quantization error $(q_m(1-z^{-1})^n)$ caused by the m-bit quantizer 54, which has been modulated by the next-stage m-bit nth-order $\Delta\Sigma$ modulator, is fed back to the first-stage 1-bit nth-order $\Delta\Sigma$ modulator, and the first-stage 1-bit nth-order $\Delta\Sigma$ modulator performs an nth-order modulation on the modulated quantization error $(q_m(1-z^{-1})^n)$.

As a result, a higher-order (2nth-order) modulation is performed on the output Y, and the 1-bit nth-order digital $\Delta\Sigma$ modulator of the fourth embodiment permits a higher degree of accuracy as compared with those according to the above-mentioned second and third embodiments. In the fourth embodiment, since the output Y is a 1-bit data stream sent out of the first-stage 1-bit nth-order $\Delta\Sigma$ modulator, no DEM is needed when the fourth embodiment is applied to a D/A converter. In addition, since no correction logic is needed, the structure of the 1-bit nth-order digital $\Delta\Sigma$ modulator is further simplified. The transfer functions of nodes are given by:

$$X_2=-q_1$$

$$Y_2=-q_1+q_m(1-z^{-c1})^n$$

$$Y=X+(1-z^{-1})^n\cdot(Y_2+q_1)$$

$$=X+q_m(1-z^{-1})^{2n}$$

In the case where the 1-bit nth-order digital $\Delta\Sigma$ modulator is a second-order modulator as shown in FIG. 5, the transfer functions are given by:

$$X_2=-q_1$$

$$Y_2=-q_1+q_m(1-z^{-1})^2$$

$$Y=X+q_m(1-z^{-1}))^4$$

Figure 6:
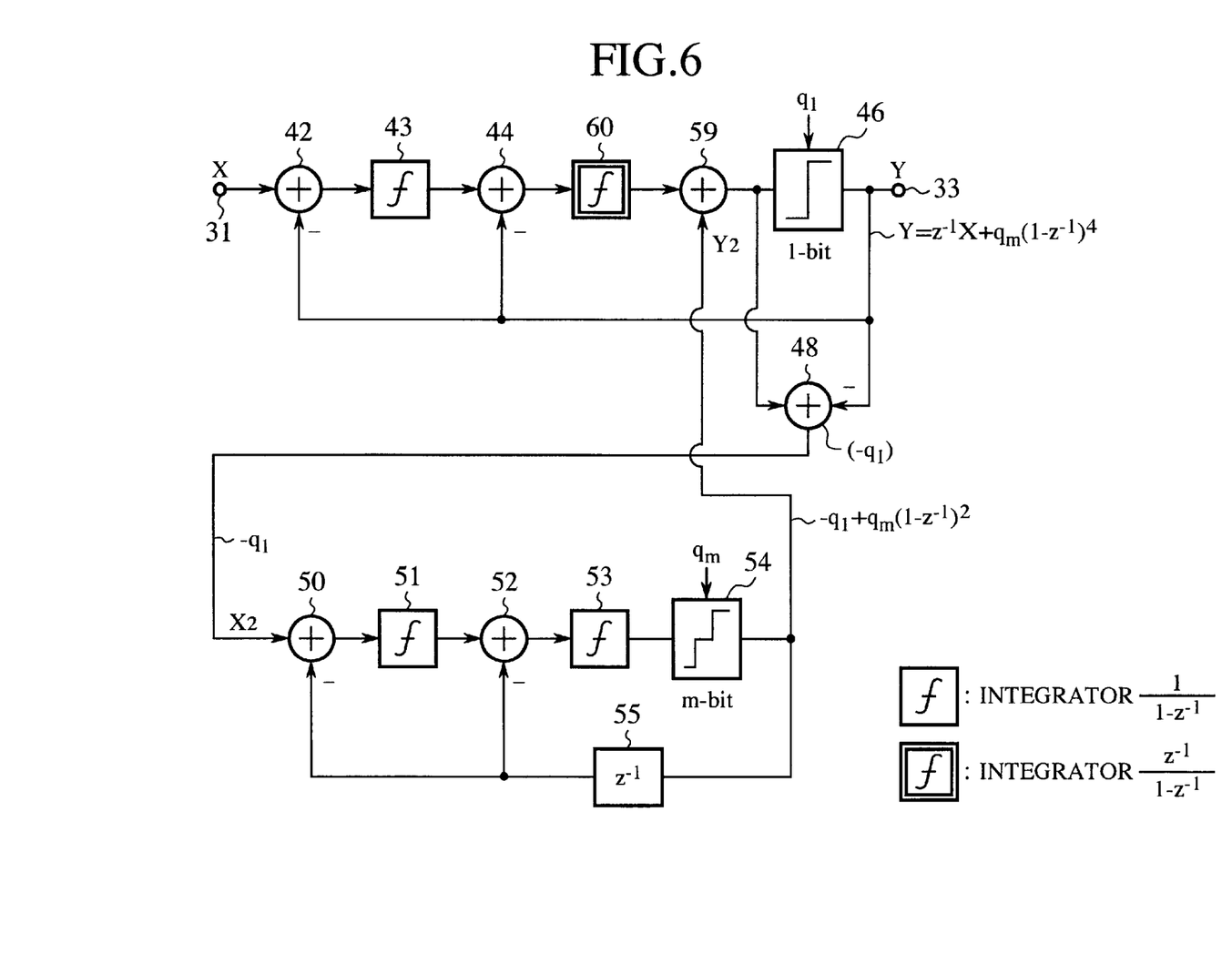
FIG. 6 is a block diagram showing the structure of a 1-bit nth-order digital ΔΣ modulator according to a variant of the fourth embodiment of the present invention.

FIG. 6 is a block diagram showing the structure of a 1-bit nth-order digital $\Delta\Sigma$ modulator according to a variant of the fourth embodiment of the present invention. In the figure, reference numeral 60 denotes an integrator disposed instead of the integrator 45 of FIG. 5, and the delay element 47 of FIG. 5 is eliminated. The variant including such the integrator 60 provides the same advantage.

Embodiment 5

Figure 7:
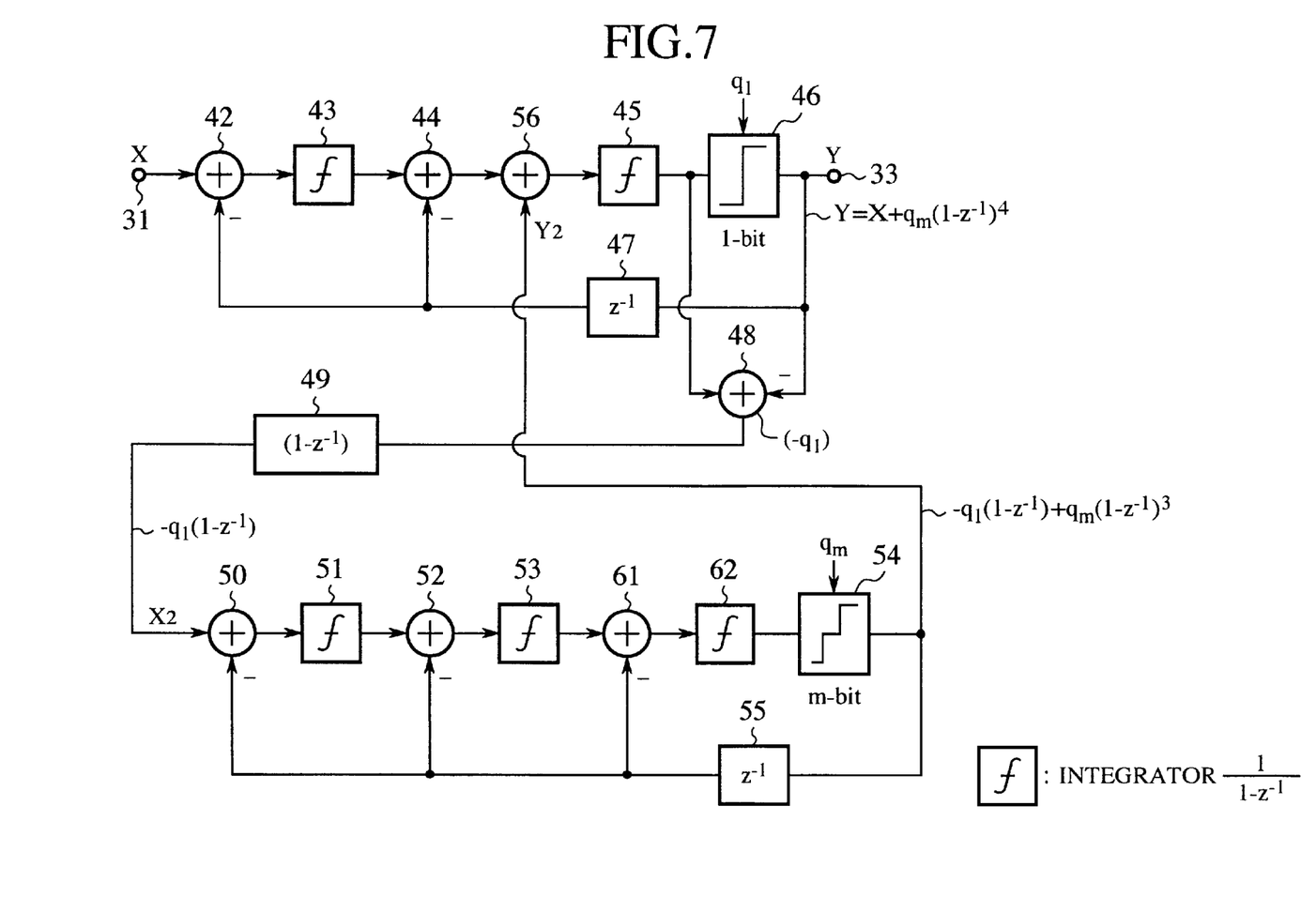
FIG. 7 is a block diagram showing the structure of a 1-bit nth-order digital ΔΣ modulator according to a fifth embodiment of the present invention.

FIG. 7 is a block diagram showing the structure of a 1-bit nth-order digital $\Delta\Sigma$ modulator according to a fifth embodiment of the present invention. In the figure, reference numeral 61 denotes a subtracter, and reference numeral 62 denotes an integrator. The other structure of the 1-bit nth-order digital $\Delta\Sigma$ modulator according to the fifth embodiment of the present invention is the same as that of the 1-bit nth-order digital $\Delta\Sigma$ modulator according to the third embodiment as shown in FIG. 3.

The 1-bit nth-order digital $\Delta\Sigma$ modulator according to the fifth embodiment as shown in FIG. 7 includes a first-stage 1-bit $\Delta\Sigma$ modulator and a next-stage m-bit $\Delta\Sigma$ modulator whose orders are different from each other and which are constructed in such a way that those of the 1-bit nth-order digital $\Delta\Sigma$ modulator according to the third embodiment are constructed. In other words, the 1-bit nth-order digital $\Delta\Sigma$ modulator of the fifth embodiment is provided with a first-stage 1-bit nth-order $\Delta\Sigma$ modulator and a next-stage m-bit pth-order (p>n) $\Delta\Sigma$ modulator (in the case of FIG. 7, n=2 and p=3).

In the example of FIG. 7, the transfer functions of nodes are given by:

$$X_2=-q_1(1-z^{-1})$$

$$Y_2=-q_1(1-z^{-1})+q_m(1-z^{-1})^3$$

$$Y=X+(1-z^{-1})\cdot Y_2+q_1(1-z^{-1})^2$$

$$=X+q_m(1-z^{-1})^4$$

While the third embodiment provides third-order noise-shaping, as mentioned above, the fifth embodiment thus provides fourth-order noise-shaping because of an increase in the order of the next-stage m-bit $\Delta\Sigma$ modulator from second-order to third-order and the modulator thus achieves a higher degree of accuracy.

The fifth embodiment can be applied to any one of the above-mentioned second and fourth embodiments. In other words, the 1-bit nth-order digital $\Delta\Sigma$ modulator according to any one of the above-mentioned second and fourth embodiments can include a next-stage m-bit pth-order (p>n) $\Delta\Sigma$ modulator.

Embodiment 6

Figure 8:
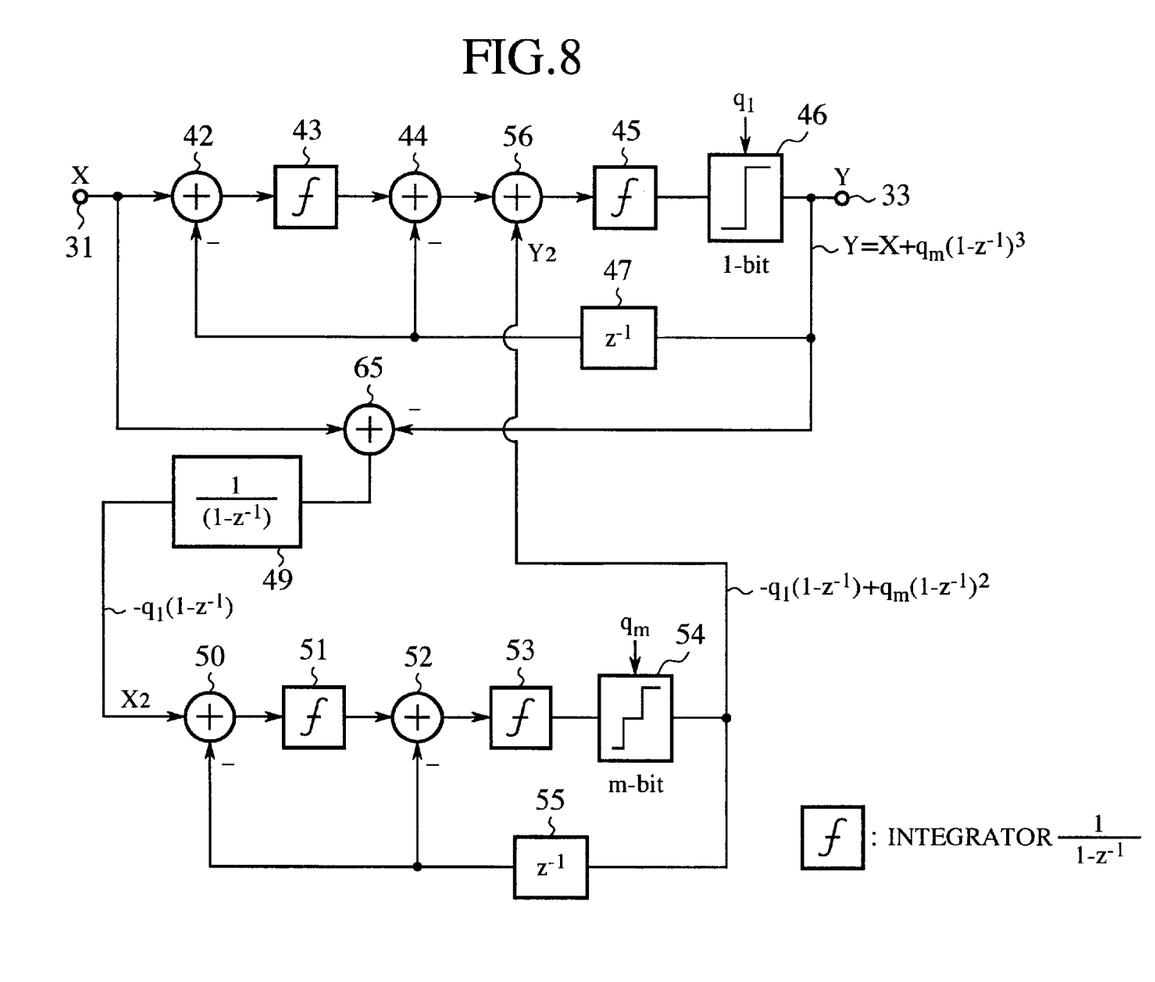
FIG. 8 is a block diagram showing the structure of a 1-bit nth-order digital ΔΣ modulator according to a sixth embodiment of the present invention.

FIG. 8 is a block diagram showing the structure of a 1-bit nth-order digital $\Delta\Sigma$ modulator according to a sixth embodiment of the present invention. In the figure, reference numeral 65 denotes a subtracter disposed instead of the subtracter 48 of FIG. 3 for acquiring a difference between input data and output data of a first-stage 1-bit nth-order ΔΣ modulator. The other structure of the 1-bit nth-order digital ΔΣ modulator according to the sixth embodiment of the present invention is the same as that of the 1-bit nth-order digital ΔΣ modulator according to the third embodiment as shown in FIG. 3.

The 1-bit nth-order digital ΔΣ modulator according to the sixth embodiment has the same structure as the 1-bit nth-order digital ΔΣ modulator according to the above-mentioned third embodiment, with the exception that the first-stage 1-bit nth-order ΔΣ modulator includes the subtracter 65 for acquiring a difference between input data and output data of the first-stage 1-bit nth-order ΔΣ modulator. The 1-bit nth-order digital ΔΣ modulator according to the sixth embodiment is not limited to the one as shown in FIG. 8, and can alternatively have a structure in which in any one of the above-mentioned second and fourth embodiments, the subtracter 48 is replaced by the subtracter 65. In either of the above-mentioned second to fourth embodiments, a differentiator is used as the correction logic 49. As an alternative, it is possible to implement the correction logic 49 by using an integrator by acquiring the difference between input data and output data of the first-stage 1-bit nth-order ΔΣ modulator by means of the subtracter 65.

When the output of a next-stage m-bit nth-order ΔΣ modulator is fed back to a node located immediately before the 1-bit quantizer 46 of the first-stage 1-bit nth-order ΔΣ modulator (i.e., in the case of the above-mentioned fourth embodiment), the order of integrators becomes its maximum: nth-order. When the output of the next-stage m-bit nth-order ΔΣ modulator is fed back to the input unit (i.e., in the case of the second embodiment), no integrator is needed.

The 1-bit nth-order digital ΔΣ modulator according to the sixth embodiment of the present invention permits accuracy similar to that provided by a prior art m-bit digital ΔΣ modulator using an m-bit quantizer even though it furnishes a 1-bit output, and no DEM is needed when the 1-bit nth-order digital ΔΣ modulator of the sixth embodiment is applied to a D/A converter. In the case of FIG. 8, the correction logic 49 is a first-order integrator, and the transfer functions of nodes are given by:

$$X_2 = (X-Y) = -q_1(1-z^{-1})^2$$

$$Y_2 = -q_1(1-z^{-1}) + q_m(1-z^{-1})^3$$

$$Y = X + (1-z^{-1}) \cdot Y_2 + q_1(1-z^{-1})^2$$

$$= X + q_m(1-z^{-1})^3$$

Embodiment 7

Figure 9:
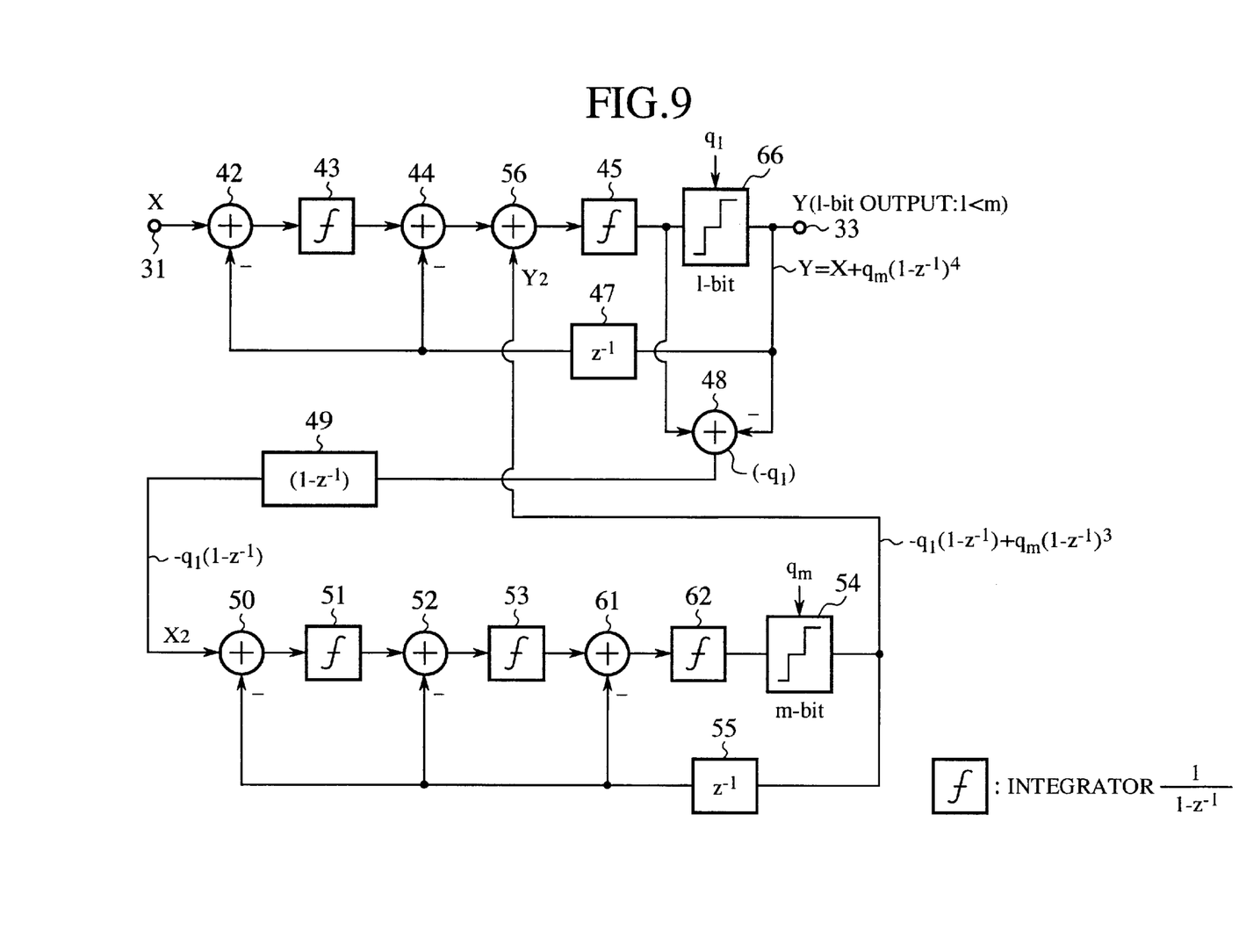
FIG. 9 is a block diagram showing the structure of an 1-bit nth-order digital ΔΣ modulator according to a seventh embodiment of the present invention.

FIG. 9 is a block diagram showing the structure of an 1-bit nth-order digital ΔΣ modulator according to a seventh embodiment of the present invention. In the figure, reference numeral 66 denotes an 1-bit (1<m) quantizer disposed instead of the 1-bit quantizer 46 of FIG. 7, for outputting an 1-bit output by way of an output unit 33. The other structure of the 1-bit nth-order digital ΔΣ modulator according to the seventh embodiment of the present invention is the same as that of the 1-bit nth-order digital ΔΣ modulator according to the fifth embodiment as shown in FIG. 7.

The 1-bit nth-order digital ΔΣ modulator according to the seventh embodiment includes the same structure as the 1-bit nth-order digital ΔΣ modulator according to the above-mentioned fifth embodiment, with the exception that the 1-bit nth-order digital ΔΣ modulator includes a first-stage 1-bit nth-order digital ΔΣ modulator having the 1-bit quantizer 66 instead of a first-stage 1-bit nth-order ΔΣ modulator having the 1-bit quantizer 46. The 1-bit nth-order digital ΔΣ modulator according to the seventh embodiment is not limited to the one as shown in FIG. 9, and can alternatively have a structure in which in any one of the above-mentioned first to fourth and sixth embodiments, the 1-bit quantizer 46 is replaced by an 1-bit quantizer 66. 1 is smaller than m in an m-bit quantizer 54 of a next-stage m-bit nth-order ΔΣ modulator.

In general, when a digital ΔΣ modulator is applied to a D/A converter, the greater number of bits per sample a quantizer included in the digital ΔΣ modulator provides, the more a DEM to be located immediately behind the digital ΔΣ modulator is complicated and the larger scale the DEM has. The structure of the seventh embodiment can reduce the number of bits of the output of the 1-bit nth-order digital ΔΣ modulator. By using a small-scale DEM as compared with a DEM needed by a prior art m-bit digital ΔΣ modulator using an m-bit quantizer, the 1-bit nth-order ΔΣ modulator according to the seventh embodiment of the present invention thus permits accuracy similar to that provided by the prior art m-bit digital ΔΣ modulator, thereby reducing the circuit scale.

Embodiment 8

Figure 10:
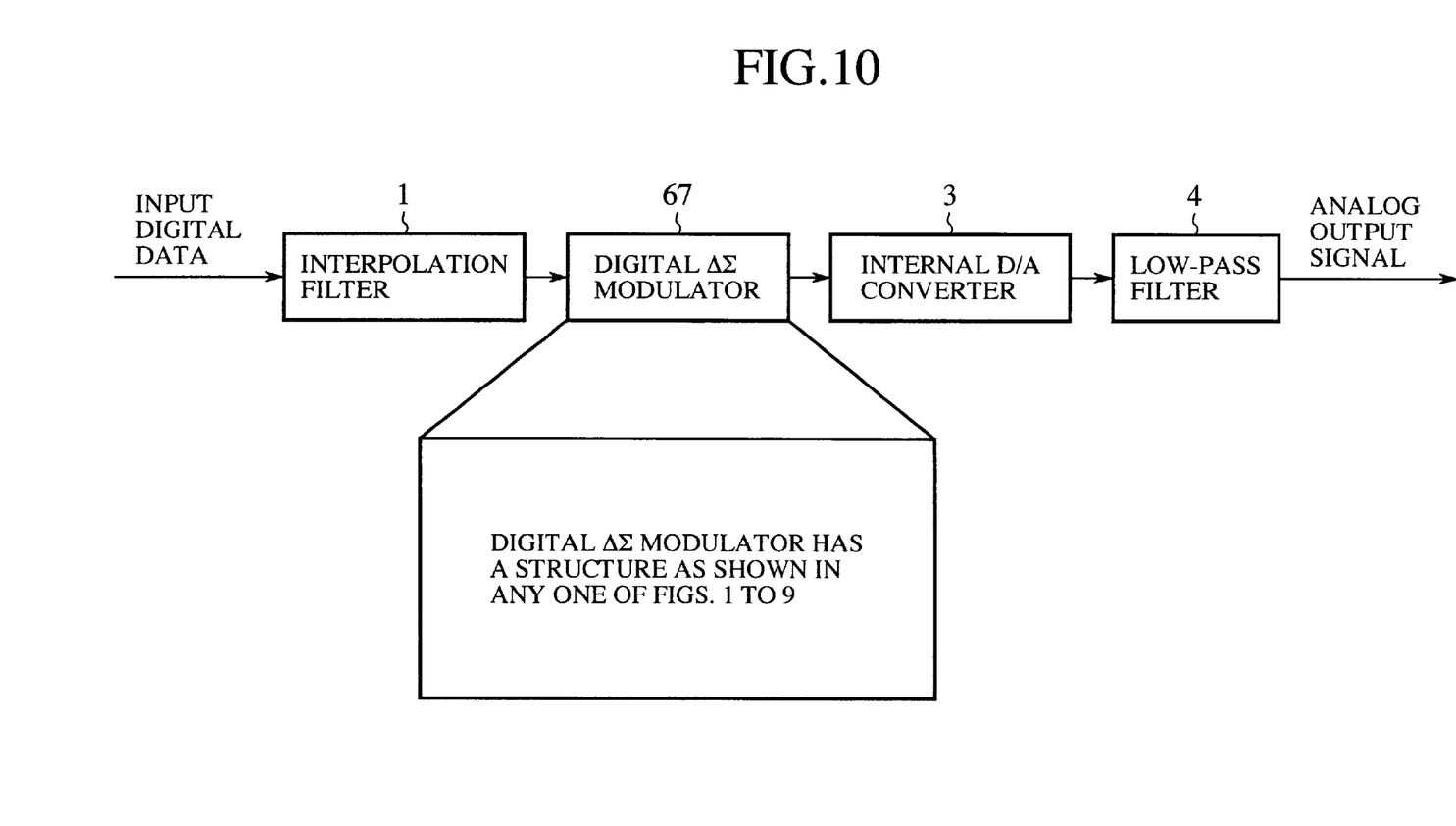
FIG. 10 is a block diagram showing the structure of a D/A converter according to an eighth embodiment of the present invention, which employs an 1-bit nth-order digital ΔΣ modulator.

FIG. 10 is a block diagram showing the structure of a D/A converter according to an eighth embodiment of the present invention, which employs a 1- or 1-bit digital ΔΣ modulator. In the figure, reference numeral 1 denotes an interpolation filter that increases the sampling rate of input digital data, reference numeral 67 denotes a digital ΔΣ modulator for modulating and noise-shaping the input digital data with the increased sampling rate and for furnishing a 1- or 1-bit output, reference numeral 3 denotes an internal D/A converter for converting the noise-shaped digital data from the digital ΔΣ modulator 67 into analog data, and reference numeral 4 denotes a low-pass filter for eliminating out of band noise included in the analog data.

The D/A converter according to the eighth embodiment of the present invention is an over sampling ΔΣ D/A converter to which a 1- or 1-bit digital ΔΣ modulator according any one of the above-mentioned first through seventh embodiments is applied.

The interpolation filter 1 increases the sampling rate of input digital data, and the digital ΔΣ modulator 67 modulates and noise-shapes the digital data with the increased sampling rate. The internal D/A converter 3 converts the noise-shaped digital data from the digital ΔΣ modulator 67 into analog data, and the low-pass filter 4 eliminates out of band noise included in the analog data and outputs the filtered analog data.

The application of a 1- or 1-bit digital ΔΣ modulator according any one of the above-mentioned first through seventh embodiments to the over sampling ΔΣ D/A converter makes it possible to simplify the structure of the D/A converter and to implement D/A conversion that permits a high degree of accuracy.

A gain stage can be inserted into the signal path of each modulator included in the digital ΔΣ modulator 67 and the feedback path of the 1- or 1-bit digital ΔΣ modulator according any one of the above-mentioned first through seventh embodiments in order to make the 1- or 1-bit digital ΔΣ modulator operate with stability.

Many widely different embodiments of the present invention may be constructed without departing from the spirit and scope of the present invention. It should be understood that the present invention is not limited to the specific embodiments described in the specification, except as defined in the appended claims.

What is claimed is:

1. A digital ΔΣ modulator comprising:
a first-stage 1-bit ΔΣ modulator provided with an 1-bit (1 is an arbitrary natural number) quantizer, for modulating digital data;
a correction logic for multiplying a quantization error caused in said 1-bit quantizer by a correction so that the quantization error caused in said 1-bit quantizer is eliminated at an output of said first-stage 1-bit ΔΣ modulator; and
a next-stage m-bit ΔΣ modulator provided with an m-bit (m is an arbitrary natural number larger than 1) quantizer, for modulating and feeding the quantization error which is multiplied by the correction by said correction logic back to said first-stage 1-bit ΔΣ modulator.

2. The digital ΔΣ modulator according to claim 1, wherein said first-stage 1-bit ΔΣ modulator is a 1-bit ΔΣ modulator having a 1-bit quantizer.

3. The digital ΔΣ modulator according to claim 1, wherein said next-stage m-bit ΔΣ modulator feeds its modulated output back to an input of said first-stage 1-bit ΔΣ modulator.

4. The digital ΔΣ modulator according to claim 1, wherein said next-stage m-bit ΔΣ modulator feeds its modulated output back to a node between two or more integrators disposed in said first-stage 1-bit ΔΣ modulator.

5. The digital ΔΣ modulator according to claim 1, wherein said next-stage m-bit ΔΣ modulator feeds its modulated output back to a node located immediately before said 1-bit quantizer of said first-stage 1-bit ΔΣ modulator.

6. The digital ΔΣ modulator according to claim 1, wherein said first-stage 1-bit ΔΣ modulator has a same order as said next-stage m-bit ΔΣ modulator.

7. The digital ΔΣ modulator according to claim 1, wherein said next-stage m-bit ΔΣ modulator has a greater order than said first-stage 1-bit ΔΣ modulator.

8. The digital ΔΣ modulator according to claim 1, wherein the quantization error caused in said 1-bit quantizer is acquired from a difference between an input and an output of said 1-bit quantizer.

9. The digital ΔΣ modulator according to claim 1, wherein the quantization error caused in said 1-bit quantizer is acquired from a difference between an input and an output of said first-stage 1-bit ΔΣ modulator.

10. A D/A converter comprising:
an interpolation filter for increasing a sampling rate of digital data;
a digital ΔΣ modulator for modulating and noise-shaping the digital data with the sampling rate increased by said interpolation filter, said digital ΔΣ modulator including a first-stage 1-bit ΔΣ modulator provided with an 1-bit (1 is an arbitrary natural number) quantizer, for modulating digital data, a correction logic for multiplying a quantization error caused in said 1-bit quantizer by a correction so that the quantization error caused in said 1-bit quantizer is eliminated at an output of said first-stage 1-bit ΔΣ modulator, and a next-stage m-bit ΔΣ modulator provided with an m-bit (m is an arbitrary natural number larger than 1) quantizer, for modulating and feeding the quantization error which is multiplied by the correction by said correction logic back to said first-stage 1-bit ΔΣ modulator;
an internal D/A converter for converting the digital data noise-shaped by said digital ΔΣ modulator into analog data; and
a low-pass filter for eliminating out of band noise included in the analog data obtained by said internal D/A converter.

11. The D/A converter according to claim 10, wherein said first-stage 1-bit ΔΣ modulator is a 1-bit ΔΣ modulator having a 1-bit quantizer.

12. The D/A converter according to claim 10, wherein said next-stage m-bit ΔΣ modulator feeds its modulated output back to an input of said first-stage 1-bit ΔΣ modulator.

13. The D/A converter according to claim 10, wherein said next-stage m-bit ΔΣ modulator feeds its modulated output back to a node between two or more integrators disposed in said first-stage 1-bit ΔΣ modulator.

14. The D/A converter according to claim 10, wherein said next-stage m-bit ΔΣ modulator feeds its modulated output back to a node located immediately before said 1-bit quantizer of said first-stage 1-bit ΔΣ modulator.

15. The D/A converter according to claim 10, wherein said first-stage 1-bit ΔΣ modulator has a same order as said next-stage m-bit ΔΣ modulator.

16. The D/A converter according to claim 10, wherein said next-stage m-bit ΔΣ modulator has a greater order than said first-stage 1-bit ΔΣ modulator.

17. The D/A converter according to claim 10, wherein the quantization error caused in said 1-bit quantizer is acquired from a difference between an input and an output of said 1-bit quantizer.

18. The D/A converter according to claim 10, wherein the quantization error caused in said 1-bit quantizer is acquired from a difference between an input and an output of said first-stage 1-bit ΔΣ modulator.

* * * * *